(12) United States Patent
Kitagawa

(10) Patent No.: US 8,704,357 B2
(45) Date of Patent: Apr. 22, 2014

(54) SEMICONDUCTOR DEVICE AND POWER SUPPLY UNIT UTILIZING THE SAME

(75) Inventor: Atsushi Kitagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 331 days.

(21) Appl. No.: 13/253,805

(22) Filed: Oct. 5, 2011

(65) Prior Publication Data

US 2012/0032713 A1 Feb. 9, 2012

Related U.S. Application Data

(62) Division of application No. 11/172,679, filed on Jun. 30, 2005, now Pat. No. 8,063,494.

(30) Foreign Application Priority Data

Jul. 21, 2004 (JP) ................................. 2004-212749

(51) Int. Cl.
*H01L 23/04* (2006.01)
(52) U.S. Cl.
USPC .......................................... 257/698; 327/434
(58) Field of Classification Search
USPC .......... 257/698, 723, 730, 738; 327/109, 419, 327/434, 482, 389, 431
See application file for complete search history.

(56) References Cited

U.S. PATENT DOCUMENTS

| 5,805,124 | A | 9/1998 | Kapoor et al. ................... 345/76 |
|---|---|---|---|
| 6,037,745 | A | 3/2000 | Koike et al. .................... 320/104 |
| 6,977,403 | B2 | 12/2005 | Seto et al. |
| 7,081,659 | B2 | 7/2006 | Seto et al. |
| 8,063,494 | B2 * | 11/2011 | Kitagawa ........................ 257/778 |
| 2003/0141529 | A1 | 7/2003 | Seto et al. |
| 2004/0023450 | A1 | 2/2004 | Katagiri et al. ................ 438/197 |
| 2004/0061220 | A1 | 4/2004 | Miyazaki et al. .............. 257/723 |
| 2004/0227666 | A1 | 11/2004 | Adachi et al. ........... 343/700 MS |
| 2012/0032713 | A1 * | 2/2012 | Kitagawa ....................... 327/109 |

FOREIGN PATENT DOCUMENTS

| JP | 07202097 A | 8/1995 |
|---|---|---|
| JP | 2000114307 A | 4/2000 |
| JP | 2003-203982 | 7/2003 |
| JP | 2003-282622 | 10/2003 |

* cited by examiner

*Primary Examiner* — Jack Chen
(74) *Attorney, Agent, or Firm* — DLA Piper LLP (US)

(57) ABSTRACT

A semiconductor device has pluralities of grid array terminals forming a grid array structure, e.g. a BGA structure, in which the output end of a built-in switch circuit is connected to multiple terminals of the grid array structure, thereby reducing the current that flows through each of the multiple terminals below a permissible level and minimizing the heat due to contact resistances of the multiple terminals in contact with the IC socket of the semiconductor device. Each pair of nearest neighbors of the multiple terminals is interposed by at least one further array terminal. The multiple terminals are all located at the outermost peripheral terminal positions of the grid array structure. Thus, the heat generated in the respective multiple terminals connected to the switch circuit is reduced, thereby minimizing the possibility of hazardous melting of the terminals.

20 Claims, 3 Drawing Sheets

SEMICONDUCTOR DEVICE AND POWER SUPPLY UNIT UTILIZING THE SAME

CROSS-REFERENCE TO RELATED APPLICATIONS

This application is a divisional of U.S. application Ser. No. 11/172,679, filed on Jun. 30, 2005, and claims the benefit of priority under 35 USC 119 of Japanese Patent Application No. 2004-212749, filed on Jul. 21, 2004, the entire contents of which are incorporated herein by reference.

FIELD OF THE INVENTION

This invention relates to a semiconductor device having built-in switching transistors, and a power supply unit utilizing such semiconductor device.

BACKGROUND OF THE INVENTION

There have been widely used switching power supply units having an integrated semiconductor circuit that includes a switching element (e.g. transistor switch) and a drive circuit controlling the switching element to control the output voltage of the switching power supply unit.

FIG. 3 shows a circuit arrangement of a conventional switching power supply unit, in which a semiconductor integrated circuit (IC) 10 has a transistor switch Qo and a drive circuit 20 for driving the transistor switch Qo. This transistor switch Qo is directly connected in series to a coil Lo via a pad Po of the IC 10. The voltage appearing at the node of the pad Po and the coil Lo is rectified and smoothed by a diode Do and a capacitor Co to provide a dc output voltage Vout.

As the transistor switch Qo is turned on, switching current Io is supplied from a power supply (e.g. a battery) having an input voltage Vin to the transistor switch Qo via the coil Lo and the pad Po, and the transistor switch Qo. The current Io grows larger with time after the transistor switch Qo is turned on. If the transistor switch Qo is turned off, the energy accumulated in the coil Lo is liberated therefrom, which is rectified and smoothed by the diode Do and the capacitor Co before it is provided as the output voltage Vout of the power supply unit, converted from the input voltage Vin.

The magnitude of the output voltage Vout is determined by the duty ratio Ton/(Ton+Toff) of ON time Ton to OFF time Toff of the transistor switch Qo. Usually, the duty ratio is controlled by feeding the drive circuit 20 a feedback voltage indicative of the output voltage Vout in such a way that the feedback voltage equilibrate with a predetermined reference voltage, thereby holding the output voltage Vout at a predetermined level.

There is a combined resistance Rp for the pad and the bonding wire connected thereto that arises from the resistances of the pad Po and the bonding wires and the contact resistance therebetween. In FIG. 3, the combined resistance Rp is shown in parentheses. A voltage drop caused by the combined resistance Rp will result in an electric power loss determined by Rp and Io.

In order to reduce the voltage drop due to the combined resistance Rp, multiple bonding wires can be parallelly connected to the terminal (see, for example, Japanese Patent Applications Laid Open No. H7-202097 and No. 2000-114307).

A wafer-level chip-sized package (WL-CSP) type IC has been increasingly adopted for miniaturization of the IC. A WL-CSP type IC has pluralities of ball-shaped terminals (hereinafter referred to as ball terminals) arranged in a two-dimensional grid array structure (the terminals in the structure referred to as ball grid array (BGA) terminals) to establish electric connections with external circuits. Each of the ball terminals is made very small in order to attain a high terminal density in the IC package.

It is therefore difficult to connect a multiplicity of bonding wires in parallel to a ball terminal of the BGA structure as shown in the above cited references. Moreover, since the ball terminals are arranged in the lattice structure, it is also difficult to make a particular terminal, such as one connected to a transistor switch, larger than other terminals.

It is noted that the current Io has a comparatively large magnitude since it pertains to the switching of a transistor switch, so that it can exceed the withstand current level (or permissible current level) of one ball terminal. The ball terminal connected to a semiconductor switch generates heat determined by the contact resistance thereof and the current Io. As a consequence, these ball terminals connected to a transistor switch are in jeopardy of being melt down by heat.

SUMMARY OF THE INVENTION

It is therefore an object of the present invention to provide a semiconductor device equipped with a built-in switch circuit and a drive circuit therefor and having pluralities of grid array terminals forming a grid array structure such as a BGA structure, wherein the multiple terminals to which the switch circuit is connected are adapted to generate only a small amount of heat, thereby decreasing the possibility of hazardous melting of the terminals.

It is another object of the invention to provide a power supply unit having improved conversion efficiency, utilizing such semiconductor device as stated above.

In accordance with one aspect of the invention, there is provided a semiconductor device equipped with a switch circuit and a drive circuit for performing ON-OFF control of the switch circuit and having grid array terminals forming a grid array structure, wherein the output end of the switch circuit is connected to multiple terminals of the grid array structure. These multiple terminals may be called as switching output terminals.

Each pair of nearest neighbors of the multiple terminals may be provided therebetween with at least one interposing terminal other than the multiple terminals.

No or only a small amount of current flows through said at least one interposing terminal as compared with the current that flows through the switch circuit.

The multiple terminals may be all located at the outermost peripheral terminal positions of the grid array structure.

The switch circuit may consist of a multiplicity of transistor switches connected in parallel with one another so as to be simultaneously turned on and off.

Each of the grid array terminals may be a ball-shaped terminal.

In accordance with another aspect of the invention, there is provided a power supply unit equipped with a semiconductor device that includes a switch circuit and a drive circuit for performing ON-OFF control of the switch circuit and has grid array terminals forming a grid array structure, wherein the output end of the switch circuit is connected to multiple terminals of the grid array structure;

the multiple terminals are connected with one another outside the semiconductor device; and the power supply unit is adapted to convert its input voltage into an output voltage under the ON-OFF control of the switch circuit.

In an inventive semiconductor device having a built-in switch circuit and a grid array terminal structure such as a BGA structure, the output end of the switch circuit is connected to multiple terminals of the grid array structure. In this arrangement, current that flows through any one grid array terminal is reduced to or less than a permissible level, so that Joule heat due to the contact resistance between the terminal and an IC socket is reduced, thereby suppressing hazardous melting of the grid array terminals.

Moreover, since the switching current is shunted to multiple terminals, the power loss that takes place in each terminal and its surrounding is reduced accordingly, which provides an improved conversion efficiency to the power supply unit.

Since each pair of nearest neighbors of the multiple terminals is provided with at least one interposing terminal through which no or little current flows, a distributed heat dissipative area is provided for the terminals. Thus, Joule heat is easily dissipated, and temperature rise in these terminals is suppressed. Since all the multiple terminals are located at the outermost peripheral terminal positions of the grid array structure, thicker, and hence less resistive, external wires can be connected to the multiple terminals, which facilitates enhanced heat radiation.

DETAILED DESCRIPTION OF THE PREFERRED EMBODIMENT

An inventive semiconductor device and a power supply unit utilizing the same will now be described by way of example with reference to the accompanying drawings.

Figure 1:
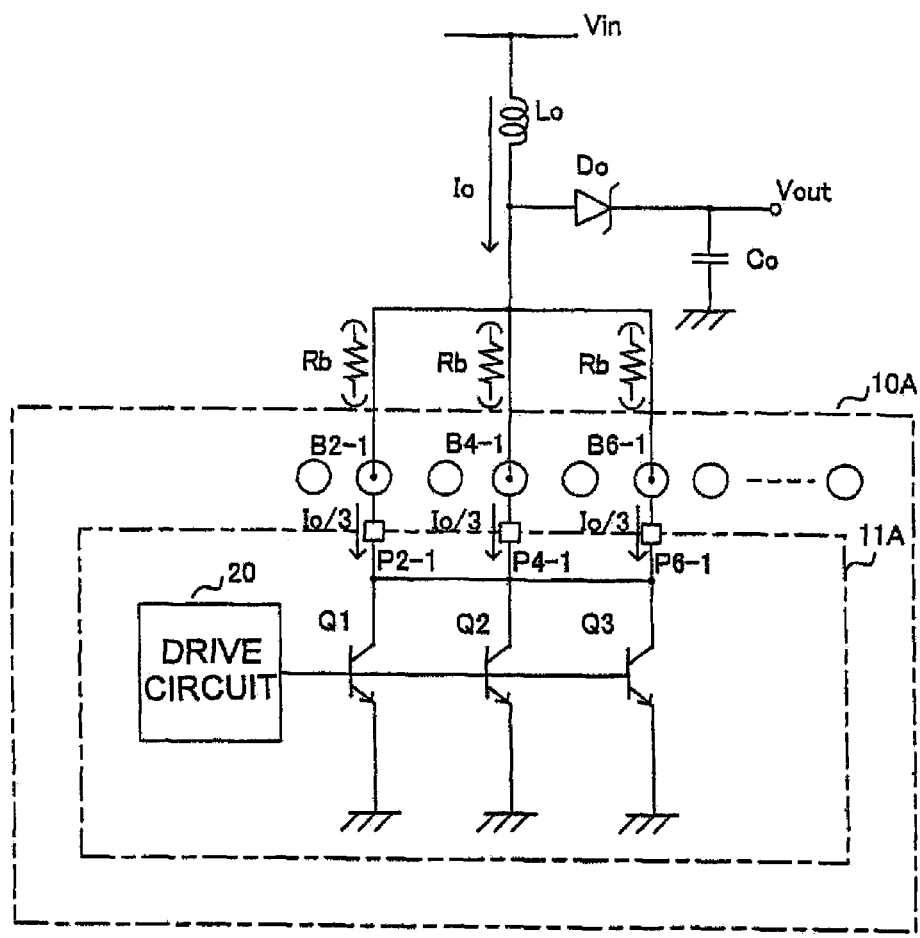
FIG. 1 shows a circuit arrangement of an IC in accordance with one embodiment of the invention and an inventive power supply unit utilizing the IC.
Figure 2:
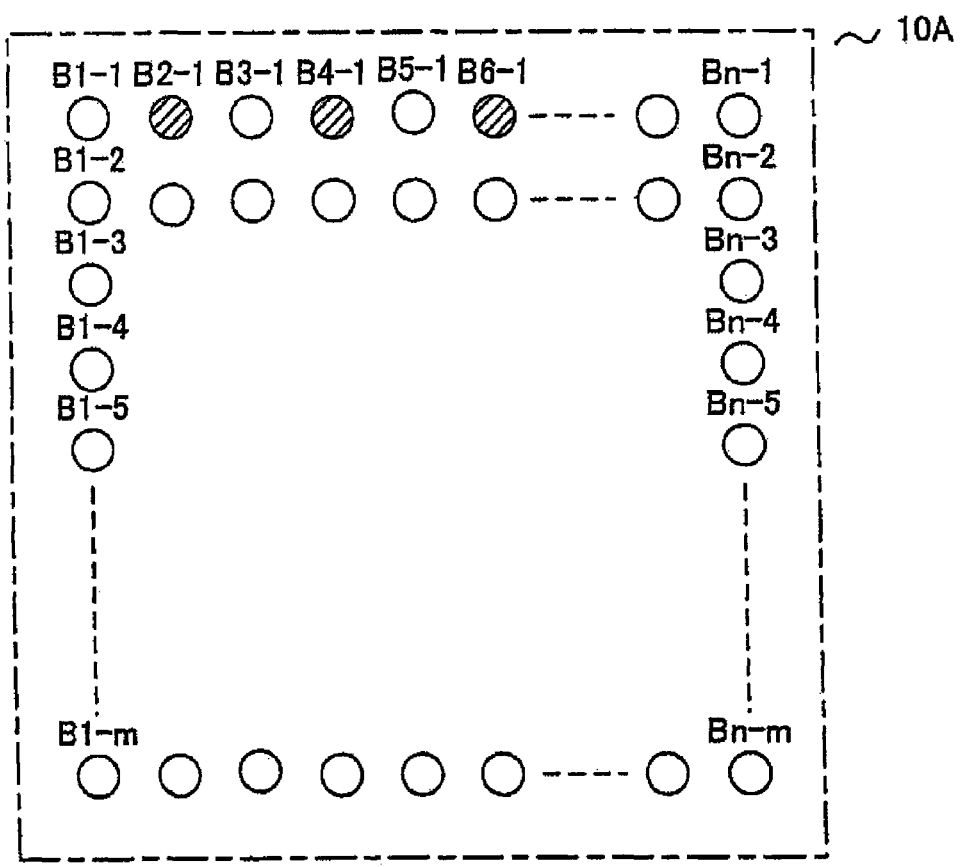
FIG. 2 shows a BGA structure of terminals on one side of the IC of FIG. 1.

Referring to FIG. 1, there is shown schematically an IC 10A in accordance with one embodiment of the invention and a power supply unit utilizing the IC 10A. The IC 10A includes an IC chip 11A. FIG. 2 shows a ball grid array (BGA) structure in which pluralities of ball terminals are arranged in a lattice configuration on one side of the IC 10A.

Figure 3:
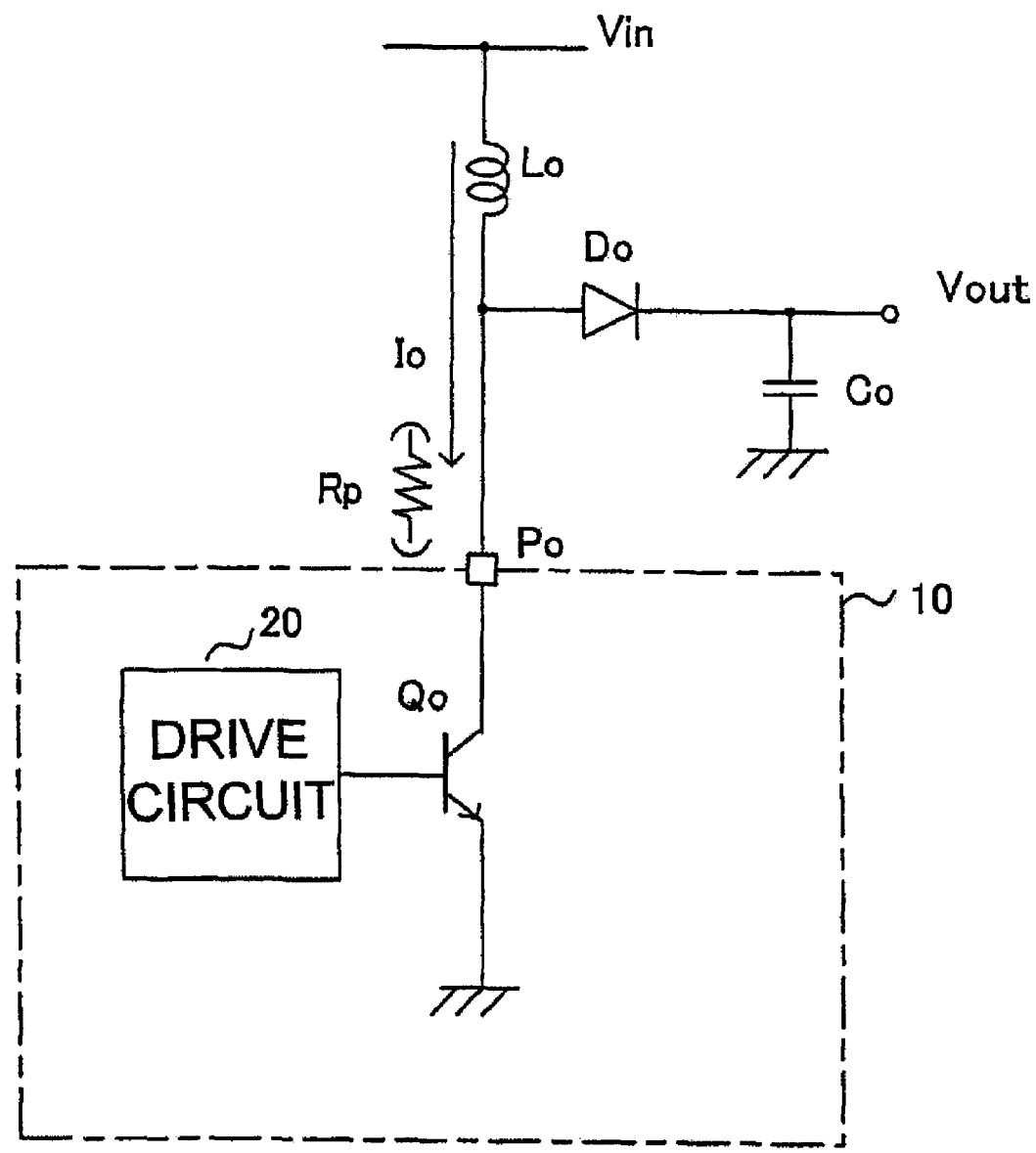
FIG. 3 shows a circuit arrangement of a conventional switching power supply unit.

Symbols Lo, Do, Co, Vin, and Vout of FIG. 3 respectively refer to a coil, a diode, a capacitor, an input voltage, and an output voltage, as in FIG. 1.

The IC 10A is a WL-CSP type IC having a reduced size. The IC 10A is a WL-CSP type IC having a reduced size. Formed on one side (e.g. backside) of the IC 10A is a BGA structure of ball terminals B1-1-Bn-m arrayed in m rows and n columns, as shown in FIG. 2.

Referring back to FIG. 1, there are shown a switch circuit consisting of transistor switches Q1-Q3, and a drive circuit 20 for driving these transistor switches Q1-Q3, all formed in the IC 10A. Although the transistor switches Q1-Q3 of the example shown herein are NPN bipolar transistors, they can be of another type of transistors such as MOSFETs for example. These transistor switches Q1-Q3 are simultaneously switched on and off by an ON-OFF drive signal issued from the drive circuit 20.

The switch circuit is shown having three transistor switches Q1-Q3, but it may have only one transistor switch. However, from the point of preventing the switch circuit from being influenced by breaking of wires and/or loose connection of terminals, it is preferred to provide the switch circuit with at least two transistor switches. Furthermore, if the switch circuit has more than one transistor switch, it has extra current drive capability.

The collectors of the transistor switches Q1-Q3 are respectively connected to multiple ball terminals B2-1, B4-1, and B6-1 belonging to the BGA terminals B1-1-Bn-m via the respective pads P2-1, P4-1, P6-1 of the IC chip 11A and the bumps associated with the pads. These collectors are preferably connected with one another.

The multiple ball terminals B2-1, B4-1, and B6-1 to which the respective collectors of the transistor switches Q1-Q3 are connected are also connected to one another outside the IC 10A. The multiple ball terminals B2-1, B4-1, and B6-1 coupled together are connected to the node of the coil Lo and the diode Do.

It should be understood that although three ball terminals are connected to the coil Lo in the example shown, two ball terminals will be sufficient in order to shunt the current Io. However, to ensure reduction of Joule heat due to the resistance Rb of a ball terminal (including contact resistance and wiring resistance) and to prevent the switching circuit from being influenced by breaking of wires and/or loose contact of pads, more than two wires are preferably connected to the coil Lo.

As the transistor switches Q1-Q3 are turned on, the current Io flowing through the coil Lo increases with time. The current Io is shunted evenly to the multiple ball terminals B2-1, B4-1, and B6-1, thereby providing each of the transistor switches Q1-Q3 with current of about Io/3.

When the transistor switches Q1-Q3 are turned off, the energy accumulated in the coil Lo will be liberated to the diode Do and the capacitor Co, where the current is rectified and smoothed before it is output as the output voltage Vout. The output voltage Vout may be controlled in the same manner as conventional, as described in connection with FIG. 3.

This arrangement permits the shunted current to each of the parallelly connected multiple ball terminals B2-1, B4-1, and B6-1 to be reduced to or below a permissible level, and causes the Joule heat due to the contact resistance of the IC 10A with the substrate to be sufficiently reduced. Accordingly, hazardous melting of the ball terminals of the BGA structure can be avoided.

Since the resultant contact resistance of the multiple ball terminals is reduced to Rb/3, the power loss by the terminals and their surroundings, is reduced. In addition, the Joule heat is distributed over the multiple ball terminals. Thus, the conversion efficiency of the power supply unit is improved accordingly.

It will be appreciated that the switch circuit is little influenced by breaking of wires and/or loose contact of the pads if it happens, due to the fact that the multiple ball terminals B2-1, B4-1, and B6-1 are parallelly connected and so are the switching transistors Q1-Q3.

Referring again to FIGS. 1 and 2, it is shown that each pair of nearest neighbors of the multiple ball terminals B2-1, B4-1, and B6-1 is provided therebetween at least one interposing ball terminal B3-1 and B5-1 other than the multiple ball terminals. It should be understood that there can be more than one interposing ball terminal between each pair of nearest neighbors of the multiple ball terminals B2-1, B4-1, and B6-1.

These interposing ball terminals are terminals through which flows no or an extremely small amount of current (e.g. Io/10) as compared with the current (Io/3) flowing through the multiple ball terminals B2-1, B4-1, and B6-1.

By placing at least one such interposing terminal in between each pair of nearest neighbors of the multiple ball terminals in the manner as described above, not only the resultant resistance of the multiple ball terminals is reduced but also the heat radiating area thereof is increased and dispersed, thereby facilitating suppression of the temperature rise in the respective multiple ball terminals.

All the multiple ball terminals B2-1, B4-1, and B6-1 are located at the outermost peripheral terminal positions of the BGA configuration. Thus, external wiring leads connected to these terminals can be made thicker to reduce their electric resistances and enhance their heat-dissipative power as compared with those connected to terminals located at inner terminal positions of the BGA structure.

It will be understood that, although the invention has been described with a particular reference to a BGA structure, the invention is not limited to the example as described and shown above. For example, the invention contemplates an IC having a pin gripped array (PGA) structure in which pluralities of pin-shaped terminals are arranged in a lattice configuration on one side of the IC.

The invention can be applied to a wide range of switching power supply units utilizing a switching circuit, including a step-up dc-dc conversion type power supply unit as shown in FIG. 1, a step-down dc-dc conversion type power supply unit and a step-down dc-ac conversion type power supply unit. The invention can be also applied to motor drivers utilizing a switch circuit.

What I claim is:

1. A semiconductor device comprising a plurality of grid alley terminals and incorporating a switch circuit composed of a plurality of transistor switches connected in parallel, wherein
control electrodes of the plurality of transistor switches are connected together,
an output electrode of the switch circuit is connected to a plurality of terminals among the grid array terminals, and
the plurality of terminals are connected together outside the semiconductor device.

2. The semiconductor device according to claim 1, wherein the plurality of transistor switches are bipolar transistors.

3. The semiconductor device according to claim 1, wherein the plurality of transistor switches are MOSFETs.

4. The semiconductor device according to claim 1, wherein the plurality of terminals are arranged such that at least one other terminal is located between every two of the plurality of terminals.

5. The semiconductor device according to claim 4, wherein the other terminal is a terminal in which no current, or only an extremely small current compared with a current passing through the switch circuit, passes.

6. The semiconductor device according to claim 4, wherein the plurality of terminals are all outermost peripheral terminals among the grid alley terminals.

7. The semiconductor device according to claim 5, wherein the plurality of terminals are all outermost peripheral terminals among the grid alley terminals.

8. The semiconductor device according to claim 1, wherein the grid alley terminals are ball grid alley terminals.

9. The semiconductor device according to claim 6, wherein the grid alley terminals are ball grid alley terminals.

10. The semiconductor device according to claim 7, wherein the grid alley terminals are ball grid alley terminals.

11. The semiconductor device according to claim 1, wherein the plurality of terminals are connected together inside the semiconductor device.

12. The semiconductor device according to claim 2, wherein the plurality of terminals are connected together inside the semiconductor device.

13. The semiconductor device according to claim 3, wherein the plurality of terminals are connected together inside the semiconductor device.

14. The semiconductor device according to claim 4, wherein the plurality of terminals are connected together inside the semiconductor device.

15. The semiconductor device according to claim 8, wherein the plurality of terminals are connected together inside the semiconductor device.

16. The semiconductor device according to claim 11, further comprising a drive circuit which turns the plurality of transistor switches on and off simultaneously, wherein
as the switch circuits are turned on and off, an input voltage is converted into an output voltage, which is output.

17. The semiconductor device according to claim 12, further comprising a drive circuit which turns the plurality of transistor switches on and off simultaneously, wherein
as the switch circuits are turned on and off, an input voltage is converted into an output voltage, which is output.

18. The semiconductor device according to claim 13, further comprising a drive circuit which turns the plurality of transistor switches on and off simultaneously, wherein
as the switch circuits are turned on and off, an input voltage is converted into an output voltage, which is output.

19. The semiconductor device according to claim 14, further comprising a drive circuit which turns the plurality of transistor switches on and off simultaneously, wherein
as the switch circuits are turned on and off, an input voltage is converted into an output voltage, which is output.

20. The semiconductor device according to claim 15, further comprising a drive circuit which turns the plurality of transistor switches on and off simultaneously, wherein
as the switch circuits are turned on and off, an input voltage is converted into an output voltage, which is output.

* * * * *